(12) United States Patent
Bierer

(10) Patent No.: US 8,283,910 B1
(45) Date of Patent: Oct. 9, 2012

(54) LONG RANGE PHASING BEACON

(76) Inventor: Walter S. Bierer, Blythewood, SC (US)

(*) Notice: Subject to any disclaimer, the term of this patent is extended or adjusted under 35 U.S.C. 154(b) by 603 days.

(21) Appl. No.: 12/613,835

(22) Filed: Nov. 6, 2009

Related U.S. Application Data

(60) Provisional application No. 61/111,897, filed on Nov. 6, 2008.

(51) Int. Cl.
*G01R 25/00* (2006.01)

(52) U.S. Cl. .............................. 324/66; 324/86

(58) Field of Classification Search .............. 324/66–67, 324/76.77, 76, 107, 138
See application file for complete search history.

(56) References Cited

U.S. PATENT DOCUMENTS

| | | | |
|---|---|---|---|
| 5,950,954 A | 9/1999 | Bierer |
| 6,275,022 B1 | 8/2001 | Bierer |
| 6,459,252 B1 | 10/2002 | Bierer |
| 6,617,840 B2 | 9/2003 | Bierer |
| 6,734,658 B1 | 5/2004 | Bierer |
| 6,753,678 B2 | 6/2004 | Bierer |
| 7,109,699 B1 | 9/2006 | Bierer |
| 7,336,063 B1 | 2/2008 | Bierer |

*Primary Examiner* — Jack W Keith
*Assistant Examiner* — Fred H Mull
(74) *Attorney, Agent, or Firm* — Michael A. Mann; Nexsen Pruet, LLC

(57) ABSTRACT

A long range wireless electrical phasing system using a centrally located beacon to transmit reference phase angle information to any number of locally handheld (Meter Probes) display modules containing a receiver to receive the distant beacon signal and a contact electrode used to contact a local electrical conductor. The display module processes the distant message and local electrical phase information and displays the exact phase angle difference of the local electrical conductor with respect to a distant reference phase.

11 Claims, 3 Drawing Sheets

SIX WAYS TO LABEL THE SAME THREE PHASES

| CLOCKWISE | | | |
|---|---|---|---|
| PHASE | 0 DEGREES | 120 DEGREES | 240 DEGREES |
| LABELS | A<br>B<br>C | B<br>C<br>A | C<br>A<br>B |

| COUNTER CLOCKWISE | | | |
|---|---|---|---|
| PHASE | 0 DEGREES | 120 DEGREES | 240 DEGREES |
| LABELS | C<br>B<br>A | B<br>A<br>C | A<br>C<br>B |

FIG.1

LONG RANGE PHASING BEACON

PRIORITY CLAIM

Priority is claimed to U.S. provisional patent application Ser. No. 61/111,897, filed Nov. 6, 2008, which is incorporated herein in its entirety by reference.

BACKGROUND OF THE INVENTION

The present invention relates to high voltage phasing tools in general and to long range wireless phasing tools in particular.

Three phase high voltage distribution and transmission systems consist of three energized conductors and a fourth neutral or ground conductor. The three energized conductors are referred to as phases and generally labeled as A, B, C or 1, 2, 3 or something similar depending on the utility. These three phases are electrically displaced by 120 degrees. In the simplest arrangement, the first phase or reference phase is considered 0 degrees, the next phase is displaced 120 degrees from the first and the last phase is displaced 240 degrees from the first.

Referring to FIG. 1, a table is provided showing the six possible ways to attach any three conductors having three phases of 0 degrees, 120 degrees, and 240 degrees. Each of these six different connections may or may not have a different outcome depending on the device(s) being powered and may or may not be considered correct for the situation. The direction of rotation of a three phase motor is determined by the placement of the three phase connections. Improper connections on a three phase motor may have disastrous effects on the results such as machinery running backwards in a manufacturing plant. Incorrectly wired three phase transformer banks, consisting of three individual transformers can produce any number of odd phase angles between 0 and 360 degrees in 30 degree steps Individual phase identification may get lost in large industrial complexes which now may exceed millions of square feet. The individual phase conductors may travel through numerous junction boxes and hundreds or thousands of feet in conduit undergoing multiple color and wire type changes as large plants expand over the decades.

Individual conductor phase identification may get lost in improperly marked underground electrical systems which now may travel for many miles underground. New construction of underground systems will require initial phase identification and verification. Mapping and phase tagging and systematic verification of system records, new and old, require phase identification. Unauthorized digging or trenching up of an underground electrical system is not uncommon resulting in loss of phase identification. Natural disasters such as earthquakes, floods, etc. may also result in loss of underground phase identification.

Individual phase identification may get lost in overhead distribution and transmission systems as well. These lines are also subject to the natural disasters mentioned above as well as hurricanes, tornadoes, forest fires, wind, snow and ice storms. Man made destruction of electric utility systems from automobiles, airplanes, trains, terrorist, war, etc. may also result in loss of phase identification.

U.S. Pat. No. 6,642,700, the disclosure of which is incorporated herein by reference, uses a full duplex communications system, such as cell phones and precision timing sources to simultaneously time tag the zero crossing or other significant features of a voltage from the electric utility grid. It has massive data storage and processing capability correlating zero crossing data until it locates similar time tags and computes phase angles based on the time difference in the time tags at the reference and field locations.

U.S. Pat. No. 7,109,699, the disclosure of which is incorporated herein by reference, also uses a full duplex communications system and multiple radio frequency translators in the communications link between the reference and field locations.

There is therefore a need for a wireless high voltage phasing tool that is accurate, easy to use and read and can be used when the high voltage distribution or transmission lines are separated by some distance.

SUMMARY OF THE INVENTION

An aspect of the present invention is related to a long range wireless phasing tool in which the zero crossing or other significant feature of a reference electrical AC voltage of a reference conductor attached to the electric utility grid is transmitted via radio frequency energy from one or more strategically located transmitters covering a large geographical area.

The radio frequency energy is received by a meter probe, provided with a display module, that is in contact with or near an energized conductor of unknown phase. The display module will display the phase angle differences between a distant reference phase conductor and the local conductor of unknown phase.

There is provided in accordance with an exemplary embodiment of the invention, a long range phasing beacon system, comprising: a wave shaper that turns an input voltage into a shaped waveform with a rapid rise time; a phase angle adjuster for setting a reference phase; an auxiliary data module for adding auxiliary data; a wave encoder that creates a data stream used to carry at least phase angle information from the shaped waveform and auxiliary data from the auxiliary data module; a transmitter that provides radio frequency energy to transmit the data stream created in the encoder; and, at least one meter probe to receive and display at least the phase angle information received from the transmitter. In some embodiments of the invention, the input voltage is 60 Hz. In some embodiments of the invention, the input voltage is 50 Hz.

In an embodiment of the invention, the auxiliary data is at least one of: the geographical coordinates of the phasing beacon, data speed, data format, and transmitter identification.

In an embodiment of the invention, the transmitter is at least one of: an electric utility two way radio system, broadcast FM radio, broadcast television, cell phone tower, or satellite communications system.

There is further provided in accordance with an exemplary embodiment of the invention, a method of using a long range phasing beacon system, comprising: inputting a reference voltage to a wave shaper; turning the input voltage into a shaped waveform; adjusting the phase angle of the shaped waveform to be set as the reference phase angle; providing auxiliary data from an auxiliary data module to an encoder; creating a data stream at the encoder which includes at least one of auxiliary data and a shaped waveform input; transmitting the data stream from a transmitter; and, receiving the data stream at a meter probe. In some embodiments of the invention, inputting is performed using a 60 Hz AC signal. In some embodiments of the invention, inputting is performed using a 50 Hz AC signal.

In an embodiment of the invention, adjusting is setting the reference phase angle to one of 0, 120 or 240 degrees.

In an embodiment of the invention, providing auxiliary data includes providing at least one of: the geographical coordinates of the phasing beacon, data speed, data format, and transmitter identification.

In an embodiment of the invention, transmitting uses at least one of: an electric utility two way radio system, broadcast FM radio, broadcast television, a cell phone tower, and a satellite communications system.

These and other features and their advantages will be readily apparent to those skilled in the art of electric utility high voltage measurements from a careful reading of the Detailed Description of Exemplary Embodiments, accompanied by the following drawings.

BRIEF DESCRIPTION OF THE DRAWINGS

An embodiment of the invention is herein described, by way of example only, with reference to the accompanying drawings. In this regard, the description taken along with the drawings makes apparent to those skilled in the art how embodiments of the invention may be practiced. It should also be understood that drawings may not be to scale In the figures, FIG. 1 is a table showing the six possible ways to attach any three conductors having three phases of 0 degrees, 120 degrees, and 240 degrees;

DETAILED DESCRIPTION OF EXEMPLARY EMBODIMENTS

The present invention is a long range phasing tool that is an improvement over existing long range phasing systems. The improvements lie in its simplicity and ease of use and its ability to measure accurately the phase, phase angle, phase sequence and/or phase rotation when the conductors are separated by some distance.

Its simplicity is exemplified in its method of use. For the first time since the advent of the interconnected electrical system (the grid), an electric utility lineman needs only to turn the display module on and touch an energized conductor and read the phase angle or other data, in an embodiment of the invention. It requires no previous setup of local auxiliary equipment such as dialing and attaching cell phones, waiting for GPS or other precision timing services to synchronize, or attaching translators or other complicated interface devices.

Figure 2:
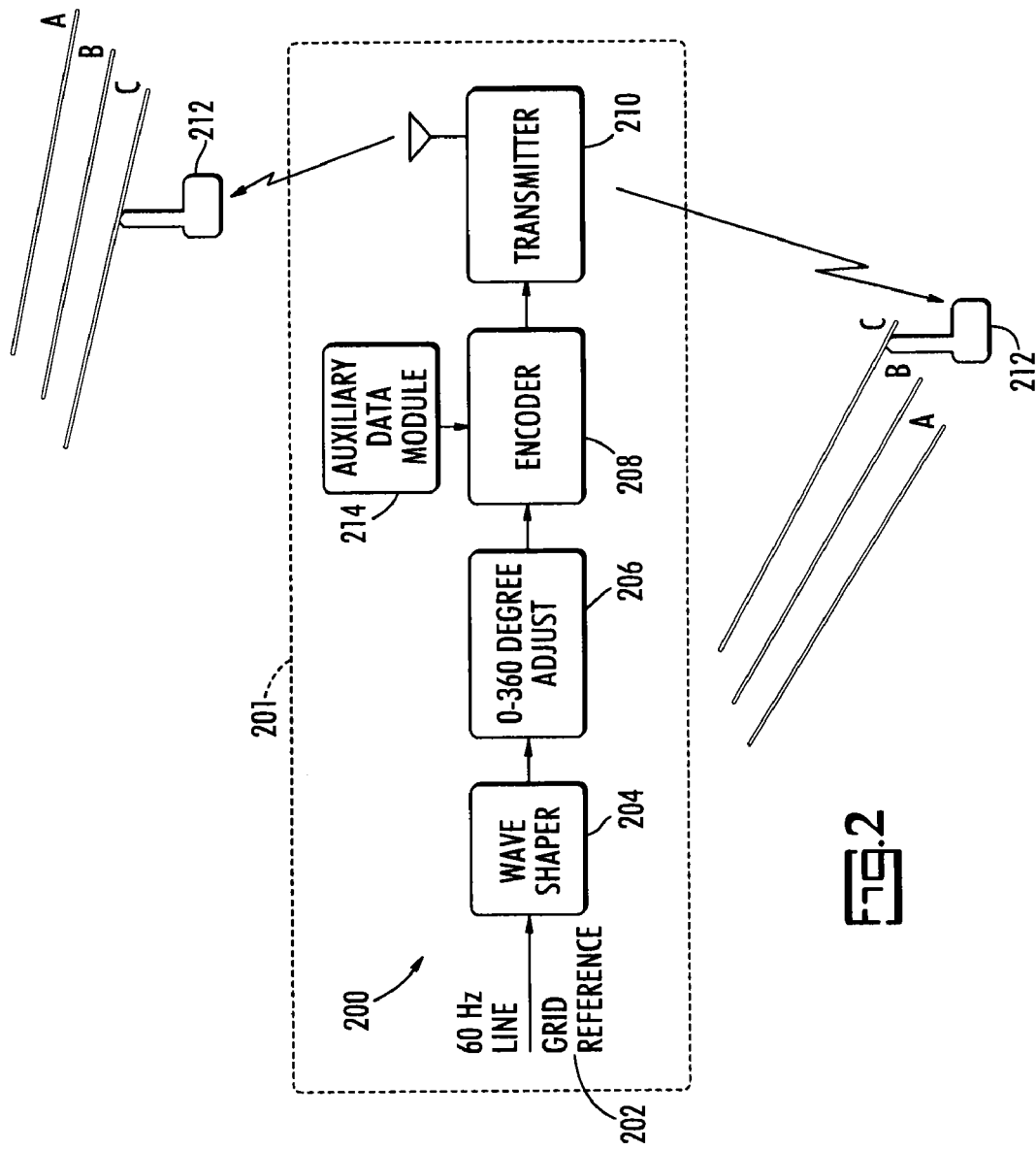
FIG. 2 is a block diagram showing a long range phasing beacon, in accordance with an exemplary embodiment of the invention; and, FIG. 3 is a method of using a long range phasing beacon, in accordance with an exemplary embodiment of the invention.
Figure 3:
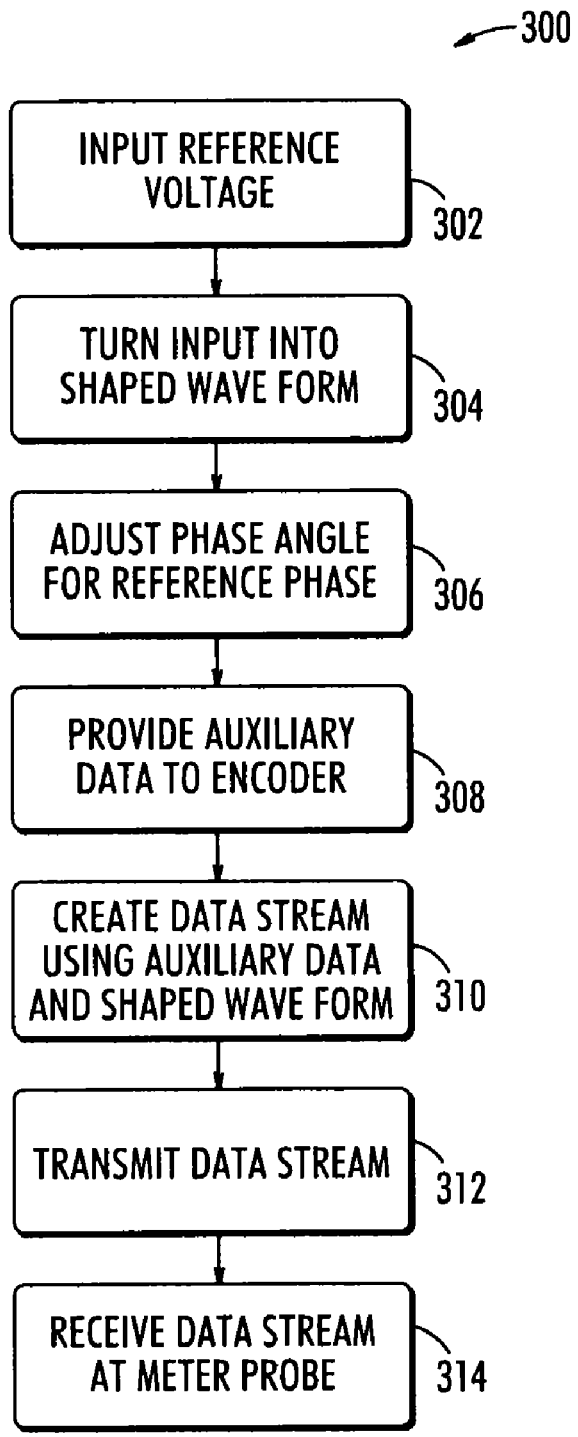

FIG. 2 is a block diagram of a long range phasing beacon system 200, in accordance with an exemplary embodiment of the invention. A voltage 202 is representative of the reference voltage, for example a 60 Hz AC voltage, and phase angle present on an energized conductor that is attached to the electric utility power grid and is input (302), shown in the flowchart 300 of FIG. 3, into a long range phasing beacon 201. In an embodiment of the invention, the long range phasing beacon 201 is comprised of at least one of a wave-shaper 204, a phase angle adjuster 206, an auxiliary data module, an encoder and/or a transmitter 210. Optionally, the reference voltage is 50 Hz. It should be understood that while much of the description is regarding 60 Hz voltage, the invention could be modified for use in 50 Hz systems.

The 60 Hz wave-shaper 204 turns (304) the AC input voltage into a 60 Hz square wave or other waveform with a rapid rise time where the zero crossing or other significant feature of AC voltage is represented by the rise time of the waveform.

The phase angle adjuster 206 allows the phase angle to be adjusted (306) from 0-360 degrees enabling the electric utility to select which phase in their system they will establish as their leading or reference phase.

The auxiliary data module 214 provides (308) the geographical coordinates of the phasing beacon, data speed, data format, and transmitter identification.

The encoder 208 takes the shaped waveform input and/or auxiliary data from the auxiliary data module 214 and creates (310) a data stream used to carry phase angle information. The phase angle information is embedded in the leading edge(s) (rise time) of significant data bits. The transmitter 210 provides the radio frequency energy to transmit (312) the phase angle information to a display module 212, for example the display module described in U.S. Pat. No. 6,734,658, the disclosure of which is incorporated herein.

The phase angle and auxiliary data may be applied to any radio frequency transmitter that is capable of covering the assigned geographical area. The transmitter 210 may dedicated to the transmission of the phase angle data or the data may be multiplexed to at least one transmitter intended for other purposes such as an electric utility two way radio system, broadcast FM radio, broadcast television, cell phone tower, satellite or other long distance communications.

The phase angle data once received (314) by the display module 212 (meter probe) will accurately display multiple parameters of an electrical system such as phase, phase angle, phase sequence and phase rotation.

Those familiar with electric utility high voltage measurements will appreciate that many modifications and substitutions can be made to the foregoing preferred embodiments of the present invention without departing from the spirit and scope of the present invention, defined by the appended claims.

What is claimed is:

1. A long range phasing beacon system, comprising:
   a wave shaper that turns an input voltage into a shaped waveform with a rapid rise time;
   a phase angle adjuster for setting a reference phase;
   an auxiliary data module for adding auxiliary data;
   a wave encoder that creates a data stream used to carry at least phase angle information from the shaped waveform and auxiliary data from the auxiliary data module;
   a transmitter that provides radio frequency energy to transmit the data stream created in the encoder; and,
   at least one meter probe to receive and display at least the phase angle information received from the transmitter.

2. A long range phasing beacon system according to claim 1, wherein the input voltage is 60 Hz.

3. A long range phasing beacon system according to claim 1, wherein the input voltage is 50 Hz.

4. A long range phasing beacon system according to claim 1, wherein the auxiliary data is at least one of: the geographical coordinates of the phasing beacon, data speed, data format, and transmitter identification.

5. A long range phasing beacon system according to claim 1, wherein the transmitter is at least one of: an electric utility two way radio system, broadcast FM radio, broadcast television, cell phone tower, or satellite communications system.

6. A method of using a long range phasing beacon system, comprising:
   inputting a reference voltage to a wave shaper;
   turning the input voltage into a shaped waveform;

adjusting the phase angle of the shaped waveform to be set as the reference phase angle;
providing auxiliary data from an auxiliary data module to an encoder;
creating a data stream at the encoder which includes at least one of auxiliary data and a shaped waveform input;
transmitting the data stream from a transmitter;
receiving the data stream at a meter probe.

7. A method according to claim 6, wherein inputting is performed using a 60 Hz AC signal.

8. A method according to claim 6, wherein inputting is performed using a 50 Hz AC signal.

9. A method according to claim 6, wherein adjusting is setting the reference phase angle to one of 0, 120 or 240 degrees.

10. A method according to claim 6, wherein providing auxiliary data includes providing at least one of: the geographical coordinates of the phasing beacon, data speed, data format, and transmitter identification.

11. A method according to claim 6, wherein transmitting uses at least one of: an electric utility two way radio system, broadcast FM radio, broadcast television, a cell phone tower, and a satellite communications system.

\* \* \* \* \*